(12) United States Patent
Seeger et al.

(10) Patent No.: US 7,863,698 B2
(45) Date of Patent: Jan. 4, 2011

(54) PERFORMANCE-ENHANCING TWO-SIDED MEMS ANCHOR DESIGN FOR VERTICALLY INTEGRATED MICROMACHINED DEVICES

(75) Inventors: Joseph Seeger, Menlo Park, CA (US); Goksen G. Yaralioglu, Mountain View, CA (US); Bruno Borovic, San Francisco, CA (US); Alexander Castro, San Jose, CA (US)

(73) Assignee: Invensense, Inc., Sunnyvale, CA (US)

( * ) Notice: Subject to any disclaimer, the term of this patent is extended or adjusted under 35 U.S.C. 154(b) by 0 days.

(21) Appl. No.: 12/418,554

(22) Filed: Apr. 3, 2009

(65) Prior Publication Data

US 2010/0252897 A1 Oct. 7, 2010

(51) Int. Cl.
*H01L 29/84* (2006.01)
(52) U.S. Cl. .............. 257/415; 257/254; 257/E29.324
(58) Field of Classification Search .............. 257/415, 257/254, E29.324
See application file for complete search history.

(56) References Cited

U.S. PATENT DOCUMENTS

| 7,104,129 B2 | 9/2006 | Nasiri et al. |
| 7,430,909 B2 | 10/2008 | Adams et al. |
| 7,478,557 B2 | 1/2009 | Geen |

*Primary Examiner*—Tan N Tran
(74) *Attorney, Agent, or Firm*—Sawyer Law Group, P.C.

(57) ABSTRACT

An anchoring assembly for anchoring MEMS device is disclosed. The anchoring assembly comprises: a top substrate; a bottom substrate substantially parallel to the top substrate; and a first portion of the anchor between the top substrate and the bottom substrate. The first portion of the anchor is rigidly connected to the top substrate; and the first portion of the anchor is rigidly connected to the bottom substrate. A second portion of the anchor is between the top substrate and the bottom substrate. The second portion of the anchor is rigidly connected to the top substrate; the second portion of the anchor being an anchoring point for the MEMS device. A substantially flexible mechanical element coupling the first portion of the anchor and the second portion of the anchor; the flexible element providing the electrical connection between the first portion of the anchor and the second portion of the anchor.

10 Claims, 20 Drawing Sheets

PERFORMANCE-ENHANCING TWO-SIDED MEMS ANCHOR DESIGN FOR VERTICALLY INTEGRATED MICROMACHINED DEVICES

FIELD OF THE INVENTION

The present invention relates generally to micro-electromechanical systems (MEMS) devices, and more particularly to the method of vertical anchoring of MEMS devices in two-sided fashion.

BACKGROUND OF THE INVENTION

Vertical integration of a micro-electro-mechanical systems (MEMS) device assumes that the MEMS structure is anchored to both top and the bottom substrate, i.e. handle, or cover, wafer and an applications specific integrated circuit (ASIC) wafer. Building mechanical structures on silicon wafer based on the deposition and etching of different structural layers is called surface micromachining. In surface micromachining usually a sacrificial layer is deposited on a substrate followed by a deposition of mechanical layer where the moving parts of the accelerometer are going to be defined. The moving parts are later released by selectively removing the sacrificial layer. This method has many shortcomings for building low cost and high performance accelerometers. For example, there are contradicting requirements over the area (cost) of the accelerometer and the noise performance. The Brownian noise level of the accelerometer is proportional to the size of the proof mass. In surface micromachining, the proof mass height is determined by the deposited film thickness which is usually limited to less than 10 microns. Therefore, building heavy proof masses requires relatively large area which in return increases the cost.

Surface micromachining also necessitates complex fabrication steps. Depositing thick films which are required for low accelerometer noise is a very sophisticated process. Moreover, non-uniformity of the deposited films and large variation of the material properties have negative impact on the process yield and cost. Controlling stress level in the film is another issue which needs to be dealt with. Otherwise undesired curling of the released structures may occur. In addition, moveable parts released by using sacrificial wet etching may suffer from the stiction problem if their mechanical properties are not selected properly. Stiction can be avoided by fabricating structures with high spring constants. But this adversely affects the sensitivity of the accelerometer where the sensitivity is inversely proportional to the resonant frequency. Therefore, stiction problem limits the accelerometer sensitivity.

In addition to the above described technical difficulties, surface micromachining tools are not readily available to small companies. Most of the required equipment can only be supported by a complicated infrastructure that only large companies can afford. This sets a very high barrier for small start-up companies that want to enter the accelerometer market. Surface micromachining is not a feasible solution for companies which do not have access to the expensive fabrication equipment.

Bulk micromachining, on the other hand, overcomes most of the technical difficulties of surface micromachining as well as providing a viable solution for fabless semiconductor MEMS companies. In contrast to surface micromachining, bulk micromachining defines structures by selectively etching the substrate. Since the height of the structures is defined in the substrate, it is possible to build accelerometers with increased height and reduced foot print without the complexities associated with building structures using deposited layers. Increased mass in a small footprint provides fabricating the accelerometer with better noise performance at a reduced cost. In addition, bulk micromachining techniques are readily available through MEMS foundries. Bulk micromachined devices can easily be built on off the shelf SOI (silicon on insulator) substrates.

Another important process step for fabricating a low cost MEMS device is the integration of mechanical parts with the electronics. To address this need a "Nasiri-Fabrication" platform is utilized which is described for example in (U.S. Pat. No. 7,104,129, entitled "Vertically integrated MEMS structure with electronics in a hermetically sealed cavity") and assigned to the assignee of this application. This fabrication process makes use of bulk micromachining and readily allows for the water level integration of the MEMS substrate and the electronics (ASIC) substrate. In addition to integration, this method encapsulates the mechanical parts in a low pressure hermetically sealed chamber that protects the MEMS device against adverse effect of environment such as humidity.

The Nasiri fabrication platform essentially requires a two-sided anchor. This type of anchor has both advantages and disadvantages over traditional one-sided anchors. To describe these features refer now to the following description in conjunction with the accompanying Figures.

The basic steps of Nasiri-fabrication are shown in FIGS. 1A-1H. A handle wafer 10 is etched to form cavities as shown in FIG. 1A and FIG. 1B. Oxide is then grown on the handle wafer 10. A handle wafer 10 and a device wafer 100 are then fusion bonded together as shown in FIG. 1C. The handle wafer 10 and the device wafer 100 form a base parallel to both wafers. The assembly comprising handle wafer 10 and the device wafer 100 is polished to achieve desired device thickness as shown in FIG. 1D. The device wafer 100 is then etched to form stand-offs 73 as shown in FIG. 1E. The stand-offs 73 are then covered by germanium 71 as shown in FIG. 1F. The device wafer 100 is then etched to form portions of MEMS device 110 (flexibly connected to the anchor) and 120 (rigidly connected to the anchor), anchoring points 130 for MEMS devices, and flexures 111 suspending the MEMS device 110 to the anchoring points 130 as shown in FIG. 1G. The MEMS device 110 and MEMS anchoring points are connected together through flexures substantially stiff in the direction perpendicular to the base. The condition on stiffness is important to prevent substantial movement of the MEMS device in the direction perpendicular to base during the eutetic bonding step. As shown in FIG. 1H, the handle and the device wafers are then eutetically bonded to the ASIC wafer 50 with exposed aluminum 72 at bonding points. Handle wafer 10 may be referred to as a top substrate and ASIC wafer 50 may be refereed to as bottom substrate.

FIG. 2 illustrates a typical anchor resulting from the Nasiri fabrication method. The anchor comprises an anchoring point 130 realized within the actuator layer which is basically the device wafer. The anchoring point 130 is rigidly connected to the top substrate 10 through the top substrate post, or short-post 20. The anchoring point is rigidly connected to the bottom substrate 50 through the eutetic bonding post comprising euteticly bonded germanium 71 and aluminum 72 and stand-off 73. Functionality of the anchoring pillar is two-pronged: it provides mechanical anchor for the MEMS device and, at the same time, electrical contact between the MEMS device 110 and bottom substrate 50 being an ASIC wafer. The problem with this two-sided anchoring is that external forces acting on the top substrate 10 may induce shear stress on the anchoring pillar and may substantially degrade the performance of the MEMS device.

Unlike the two-sided anchor shown in FIG. 2, a typical MEMS anchors fabricated in surface micromachining shown in FIG. 3 does not have such a problem. Surface machining anchor is rigidly connected only to one wafer 50. Lack of the post 20 prevents shear stress from acting upon the anchor 130 and MEMS device 110.

In particular, U.S. Pat. No. 7,478,557, entitled "Common centroid micromachine driver" discloses various types of MEMS anchors as well as anchoring suspensions. These types of MEMS anchors are related to improved package and over-temperature performance of the structures but they are addressing a different problem—a one-side anchor, as shown in FIG. 3.

U.S. Patent publication application 20070119252 (U.S. Pat. No. 7,430,909) discloses a MEMS accelerometer, and some of the disclosures are related to the improved package and over-temperature performance improvements. However, it is also related to the one-sided anchor of FIG. 3.

Accordingly, what is desired is anchor design that addresses the disadvantages of the Nasiri fabrication design and appears similar to the single sided anchor design while retaining the benefits of the Nasiri fabrication technique. The present invention addresses such a need.

SUMMARY

Accordingly, it is an object of the invention to provide an anchoring for a micro-electro-mechanical systems (MEMS) device having improved performance when external forces are applied to the top substrate (handle wafer). Another object of the invention is to provide an anchoring for a MEMS device having improved performance when external forces are applied to the top substrate (handle wafer), when an MEMS device has electrodes on the bottom substrate. A further object of the invention is the method of achieving good bond below two portions of the anchor without having the top portion of the anchor—in terms of flexure design (rigid in one and flexible in the other direction), and in terms of material reflow across continious bonding interface.

An assembly for anchoring a micro-electro-mechanical systems (MEMS) device is disclosed. The assembly comprises: a top substrate; a bottom substrate substantially parallel to the top substrate; and a first portion of the anchor between the top substrate and the bottom substrate. The first portion of the anchor is rigidly connected to the top substrate; and the first portion of the anchor is rigidly connected to the bottom substrate. A second portion of the anchor is between the top substrate and the bottom substrate. The second portion of the anchor is rigidly connected to the top substrate; the second portion of the anchor being an anchoring point for the MEMS device. A substantially flexible mechanical element coupling the first portion of the anchor and the second portion of the anchor; the flexible element providing the electrical connection between the first portion of the anchor and the second portion of the anchor.

A micro-electro-mechanical systems (MEMS) device is disclosed. The MEMS device comprises: a first (or top) substrate being cover; an actuator layer; a second (or bottom) substrate being ASIC; an anchor subassembly in actuator layer; wherein anchor subassembly has two parts. A first portion of the anchor between the top substrate and the bottom substrate; the first portion of the anchor rigidly connected to the top substrate; and the first portion of the anchor rigidly connected to the bottom substrate. A second portion of the anchor between the top substrate and the bottom substrate; the second portion of the anchor rigidly connected to the top substrate; the second portion of the anchor being an anchoring point for the MEMS device. A substantially flexible mechanical element coupling the first portion of the anchor and the second portion of the anchor; the flexible element providing the electrical connection between the first portion of the anchor and the second portion of the anchor.

DETAILED DESCRIPTION OF PREFERRED EMBODIMENTS

The present invention relates generally to micro-electro-mechanical systems (MEMS) devices, and more particularly to the method of vertical anchoring of MEMS devices in two-sided fashion. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1A:
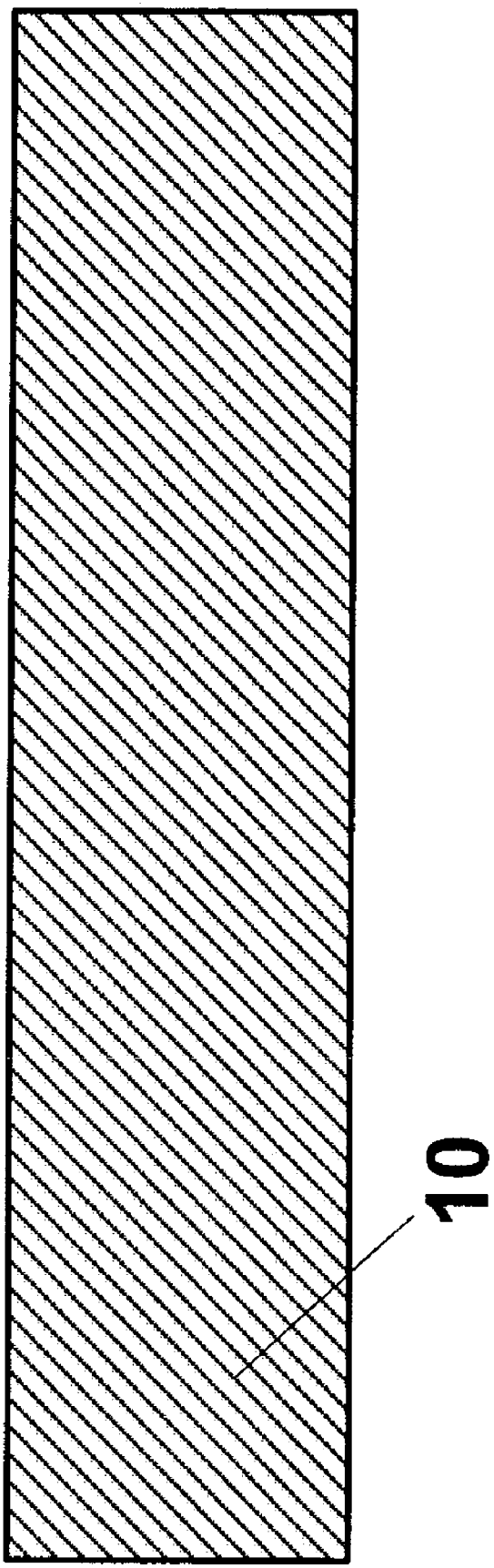
FIG. 1A-1H illustrates Nasiri fabrication steps.
Figure 1B:
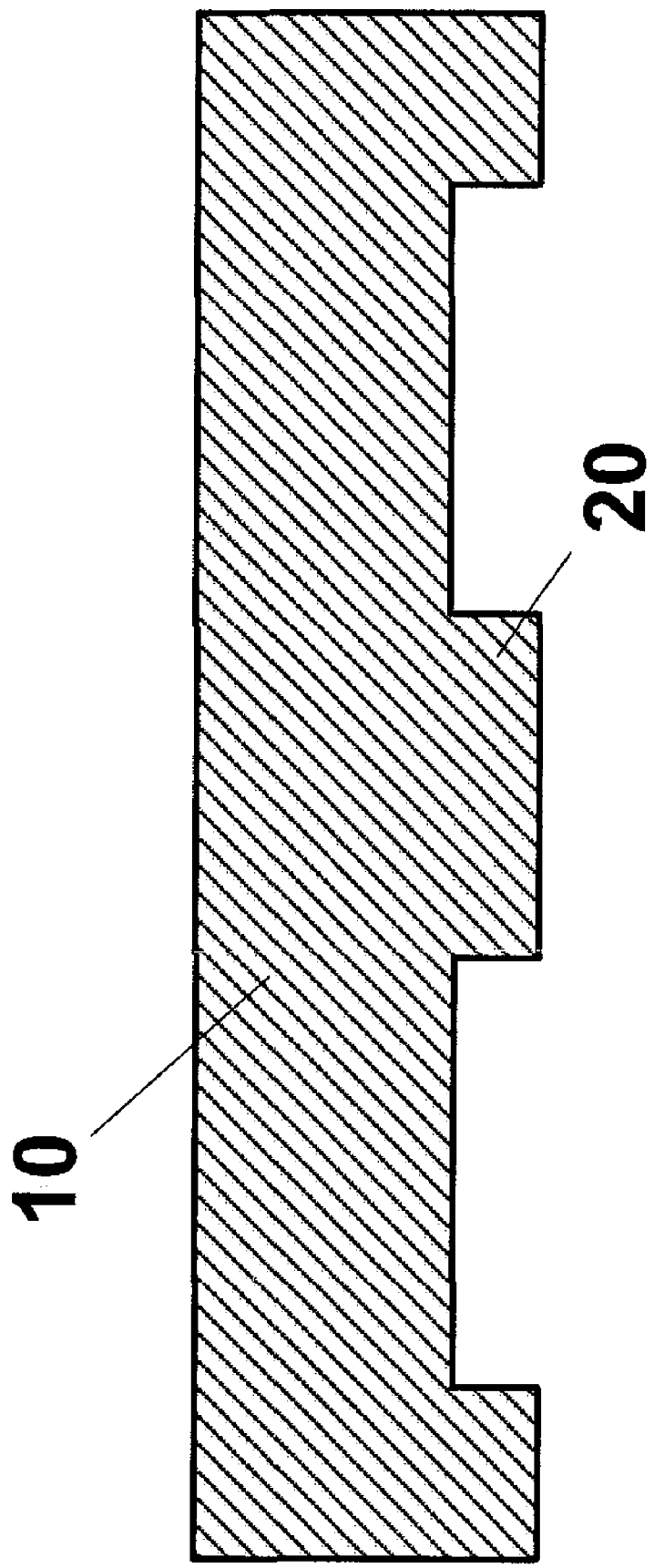
Figure 1C:
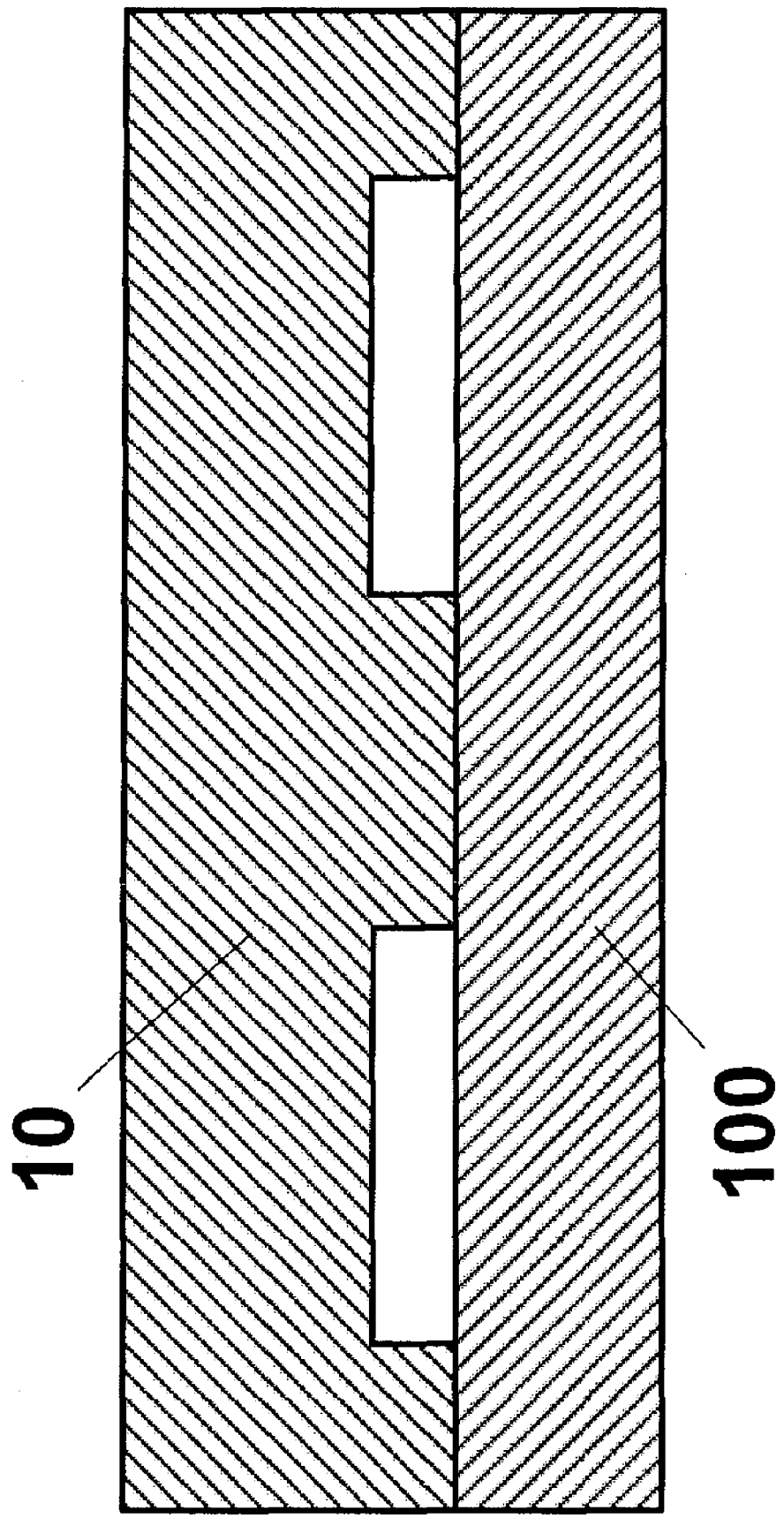
Figure 1D:
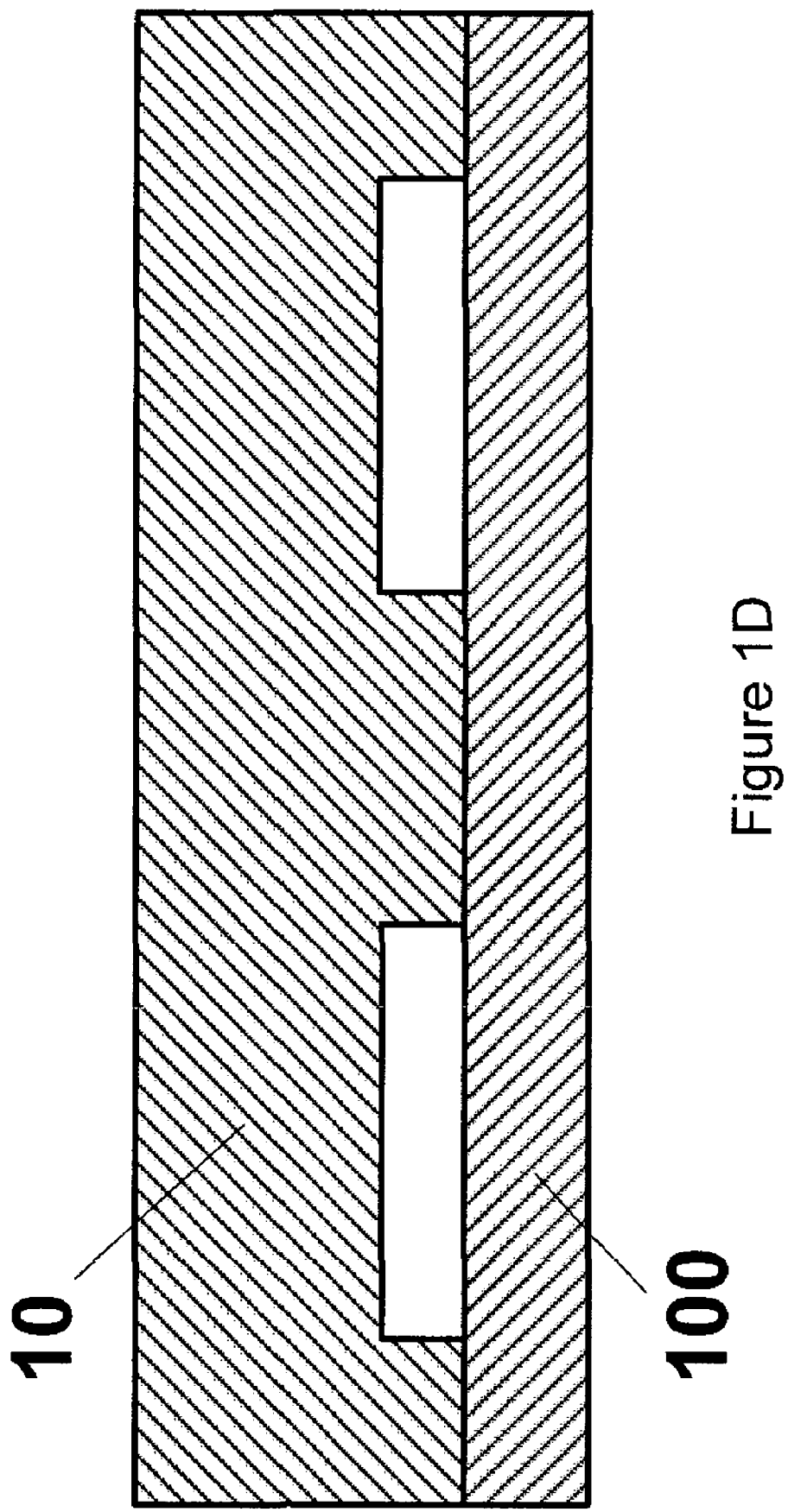
Figure 1E:
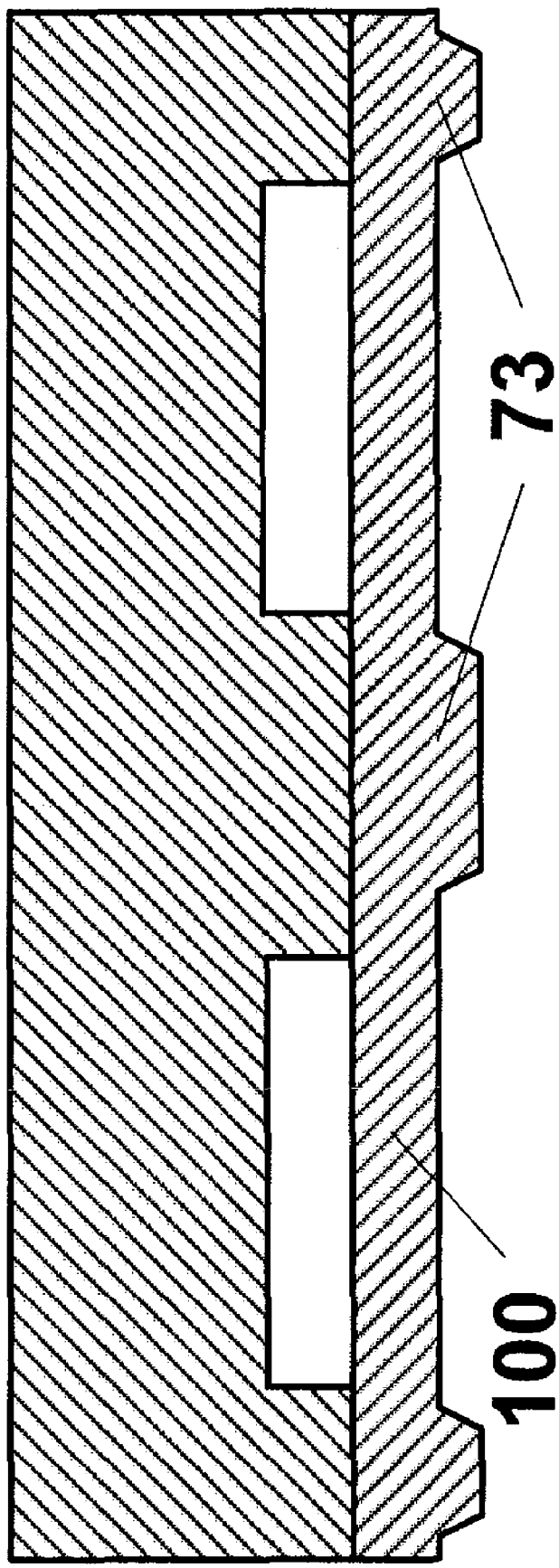
Figure 1F:
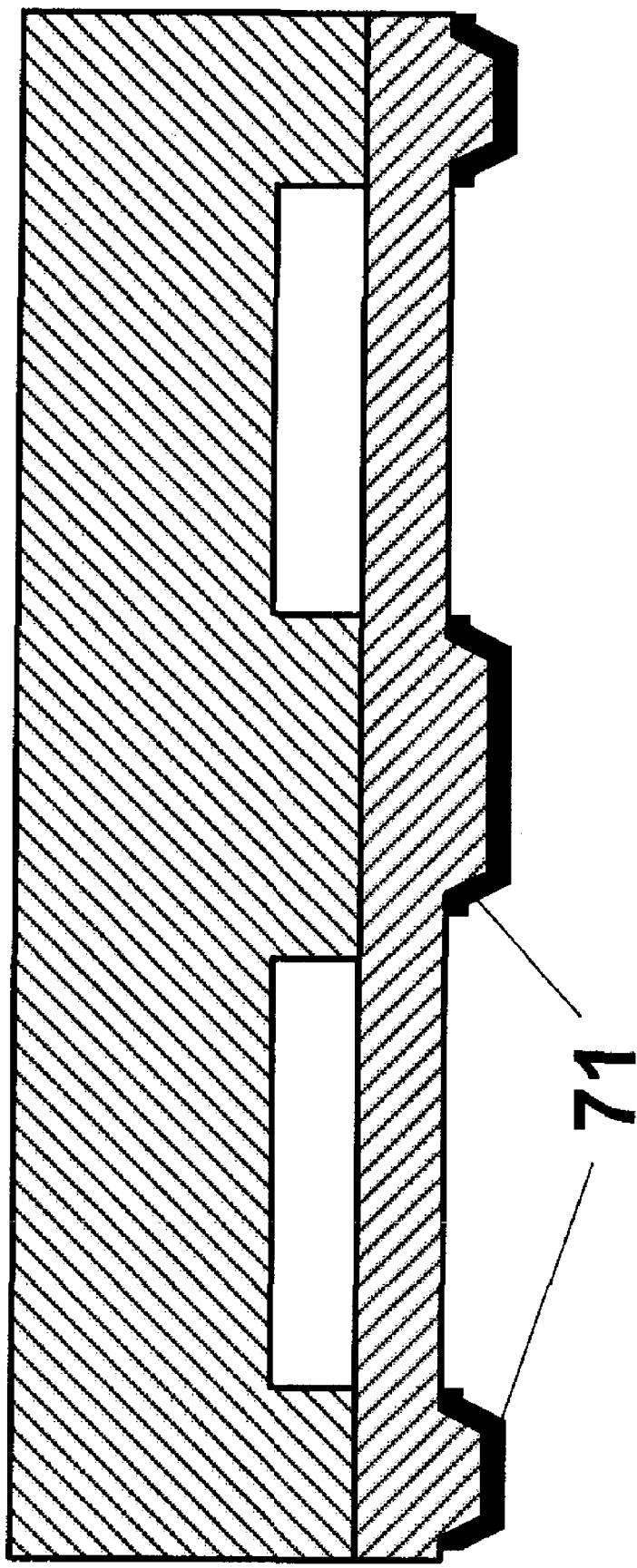
Figure 1G:
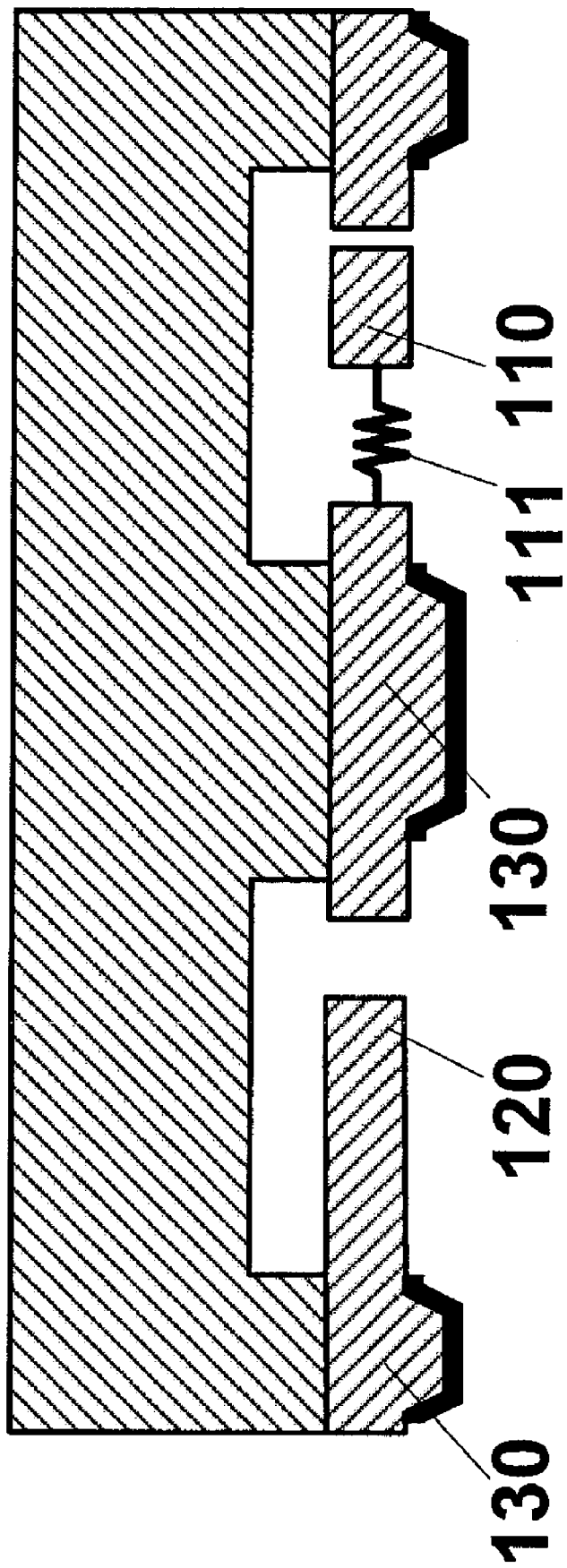
Figure 1H:
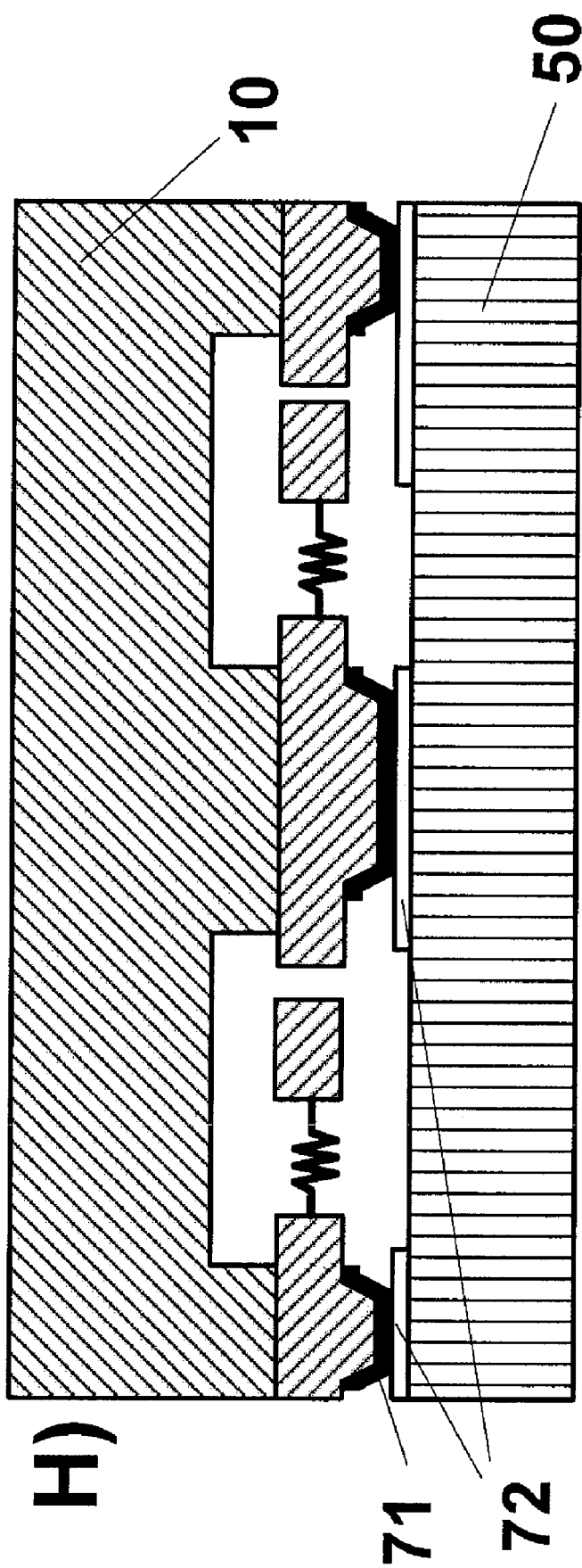
Figure 2:
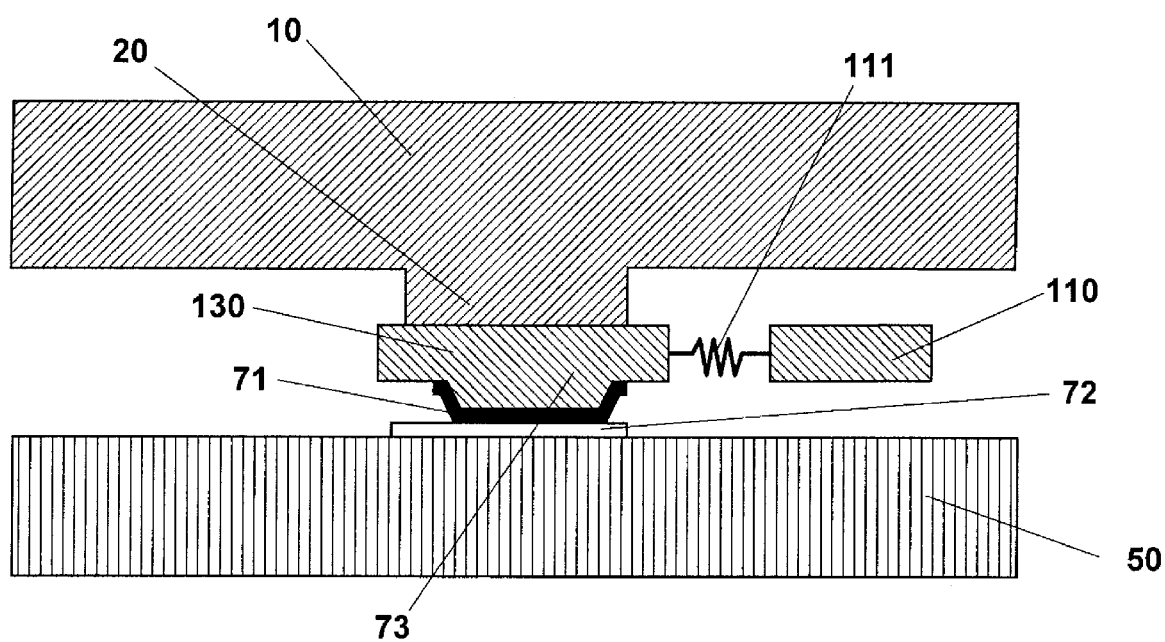
FIG. 2 illustrates a typical Nasiri fabrication anchor.
Figure 3:
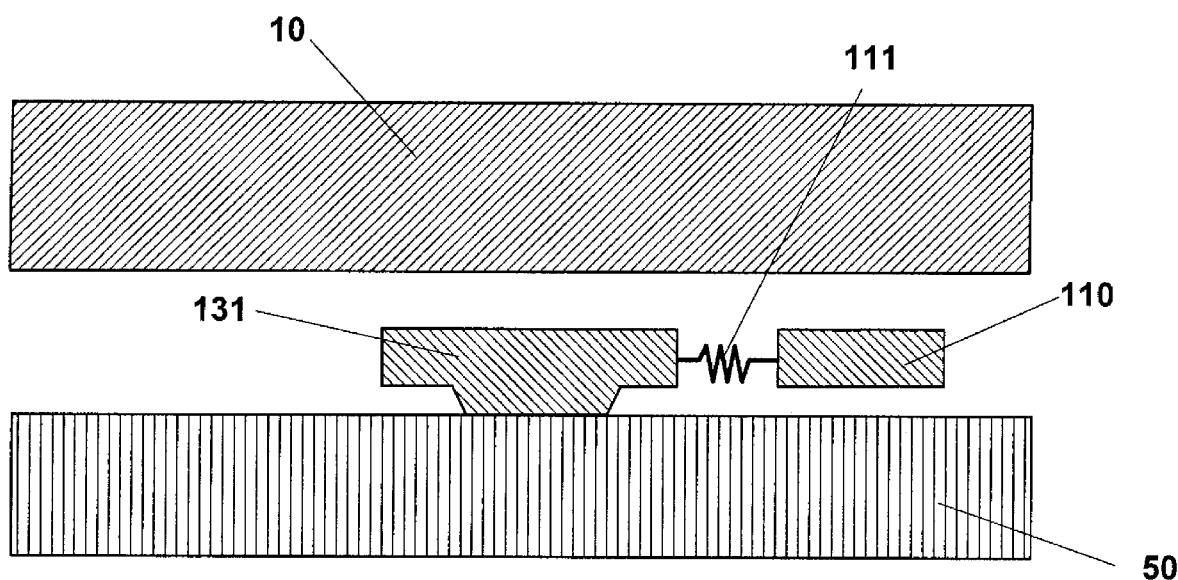
FIG. 3 illustrates a typical surface micromachining anchor.
Figure 4A:
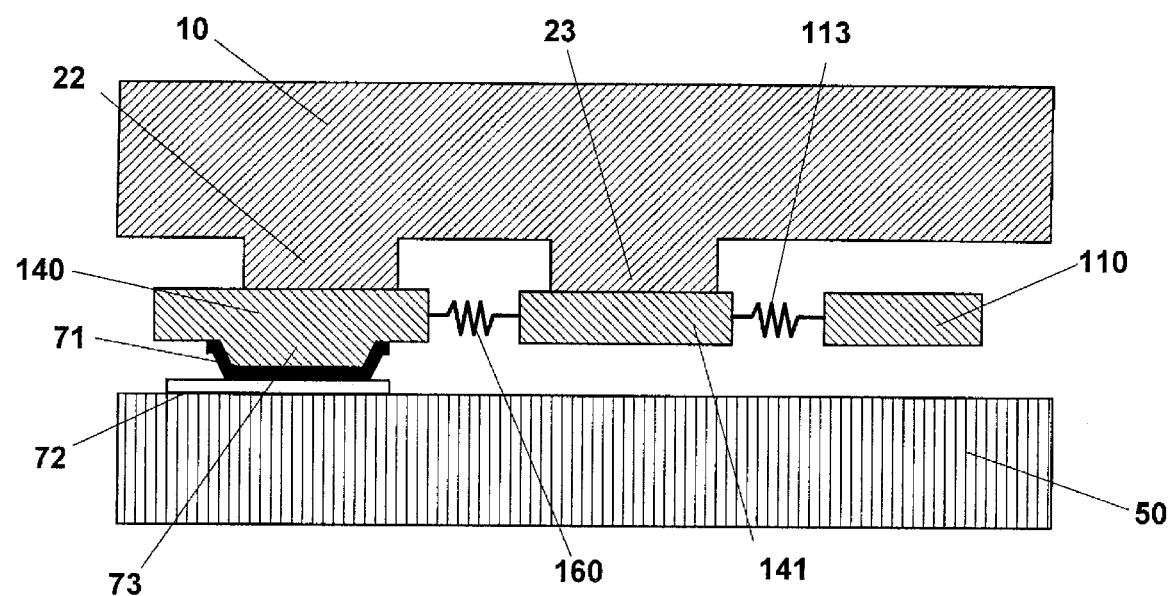
FIG. 4A illustrates a first embodiment of an anchoring system in accordance with an embodiment.

FIG. 4A illustrates a first embodiment of an anchoring system in accordance with an embodiment. The anchoring system comprises a first portion 140 and a second portion 141. In this embodiment the first portion 140 of the anchoring system is rigidly suspended between the top substrate 10 and the bottom substrate 50 through a post 22 and eutetic assembly comprising aluminum germanium bond 71-72. The second portion 141 of the anchoring system is rigidly suspended only to the top substrate 10 through a post 23. The first portion 140 of the anchoring system and the second portion 141 of the anchoring system are flexibly connected through the flexure 160. The function of the flexure 160 is to provide electrical contact between the MEMS device 110 and the bottom substrate 50 through the eutetic bond 71-72. The second portion 141 of the anchoring system acts as a mechanical anchor only and it is an anchoring point for the MEMS device 110. From the mechanical point of view, second portion 141, post 23 and flexure 113 should perform similar to assembly 131, 110 and 111 from the surface micromachined anchor of FIG. 3.

Figure 4B:
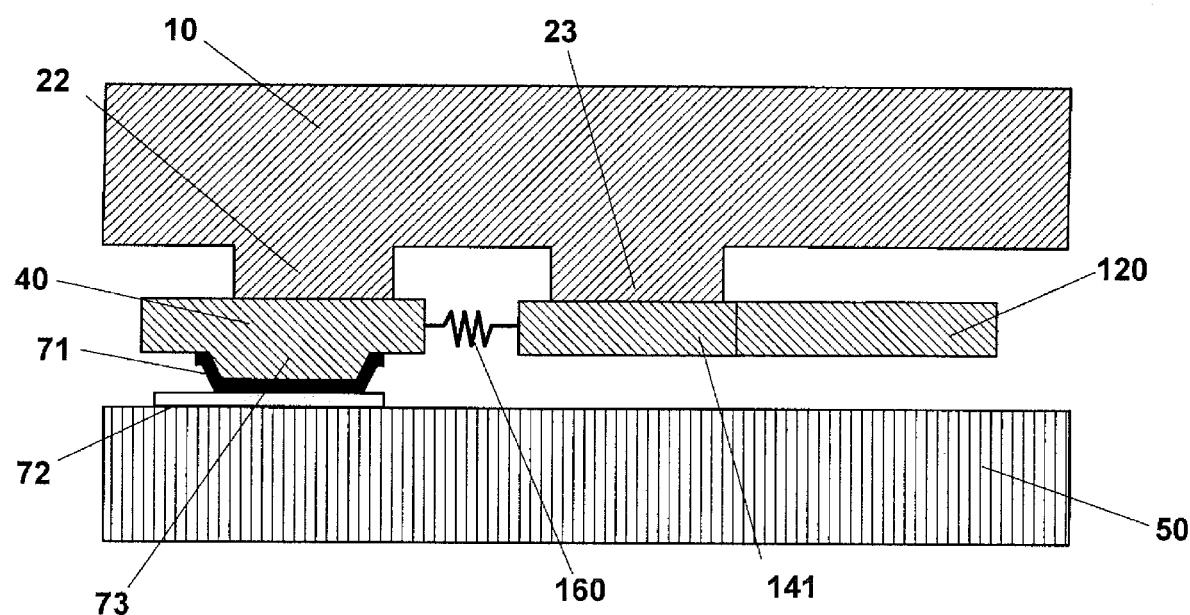
FIG. 4B illustrates a second embodiment of an anchoring system in accordance with an embodiment.

FIG. 4B illustrates a second embodiment of an anchoring system in accordance with an embodiment. In this embodiment the elements are similar to the elements shown in FIG. 4A, however, the second portion 141 of the anchoring system is rigidly connected to the MEMS device 120.

Figure 5:
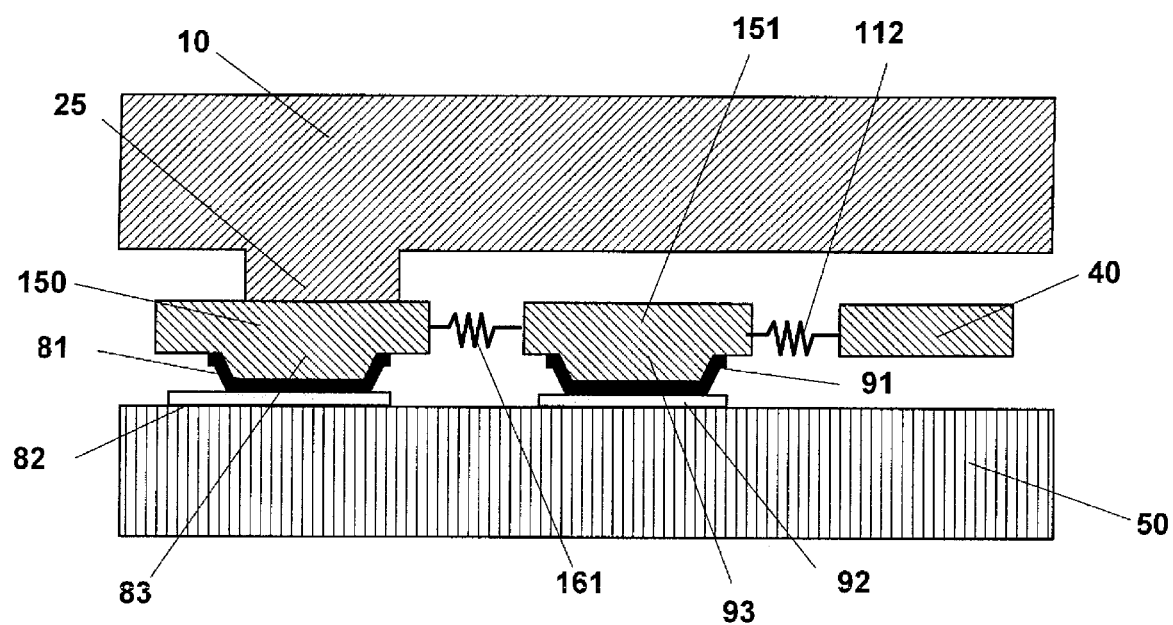
FIG. 5 illustrates a third embodiment of an anchoring system.

FIG. 5 illustrates a third embodiment of an anchoring system. In this embodiment, a first portion 150 of the anchoring system is rigidly suspended between top substrate 10 and the bottom substrate 50 through the post 25 and eutetic assembly comprising stand-off 83 and aluminum-germanium bond 81-82. A second portion 151 of the anchoring system is rigidly suspended only to the bottom substrate 10 through the second portion of the eutetic assembly comprising stand-off 93 and aluminum-germanium bond 91-92. The first portion 150 of the anchoring system and the second portion 151 of the anchoring system are flexibly connected through the flexure 161. The second portion 151 of the anchoring system acts as a mechanical anchor only and it is an anchoring point for the MEMS device 40. From the mechanical point of view, anchor 151, and post 93, 92 and 91 and flexure 112 should perform similarly to assembly 131, 110 and 111 of the surface micromachined anchor of FIG. 3.

Figure 6:
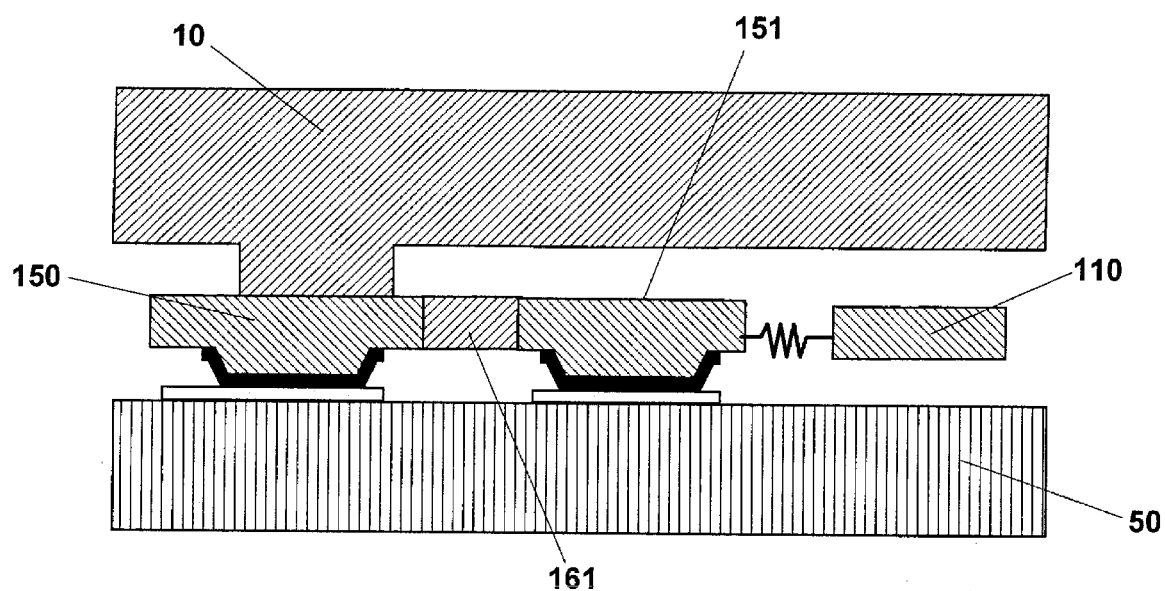
FIG. 6 illustrates a flexure configuration.

The flexible element 161 from FIG. 5 should be substantially rigid in the direction perpendicular to the top substrate 10 and also to the direction perpendicular to the bottom substrate to provide enough pressure for eutetic bonding. On the other side, the flexure 161 should be compliant enough in the direction parallel to the top substrate 10 and the bottom substrate 50 and in the direction where shear stress has to be avoided. Flexure configuration is illustrated in FIG. 6.

Figure 7A:
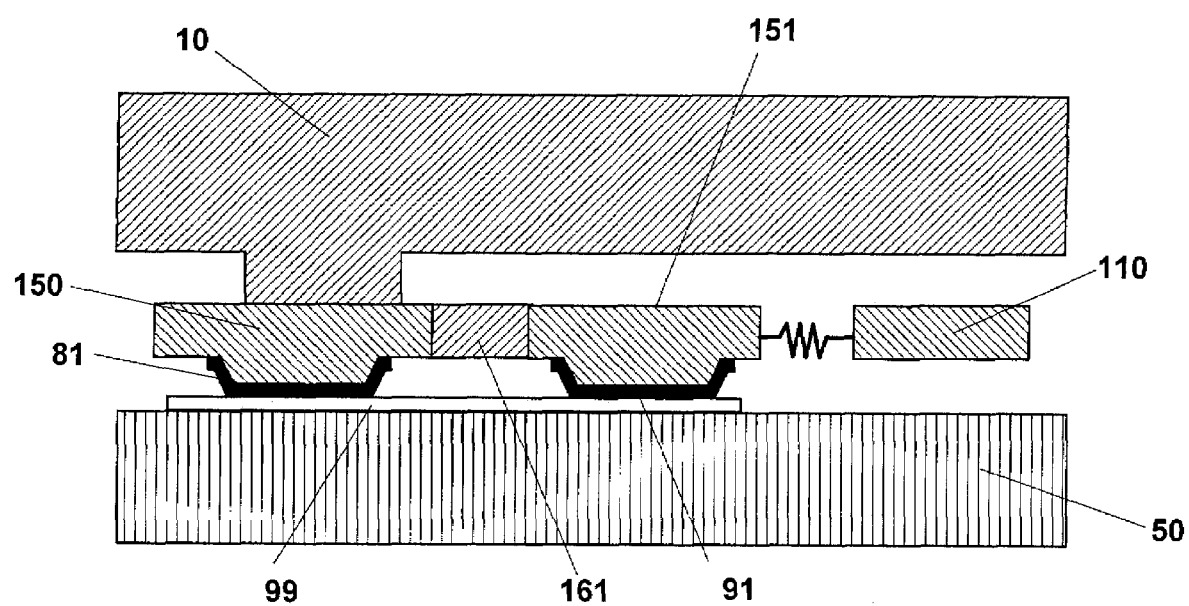
FIG. 7A illustrates a configuration that improves bonding by allowing the material to reflow.

Another way to further ensure proper bonding is to make aluminum the plate where bonding occurs shared between portions 150 and 151 of the anchoring system. Portions 150 and 151 with germanium deposits 81 and 91 are eutecticly bonded to an exposed and continuous aluminum plate 99 on the bottom substrate 50. Bond starts forming under the first portion of the portion 150 where substantially high pressure exists. Material reflows and bond propagates towards the second portion of the portion 151. It is favourable for the reflow if germanium deposits 81 and 91 are substantially close to each other. A configuration that improves bonding by allowing the material to reflow is illustrated in FIG. 7A.

Figure 7B:
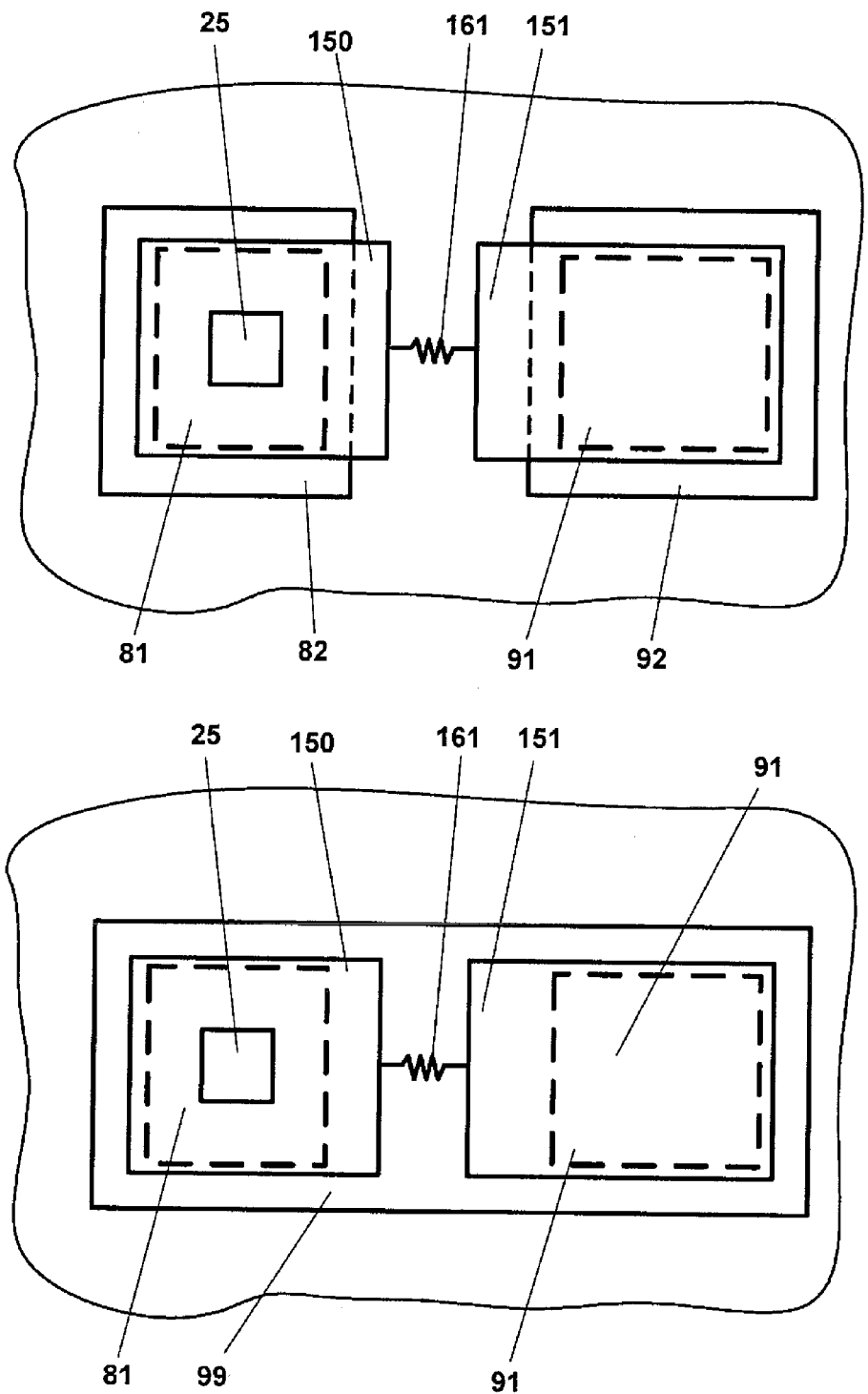
FIG. 7B illustrates the difference between non-continous and continous aluminum.

FIG. 7B illustrates the difference between non-continous and continous aluminum.

Figure 8:
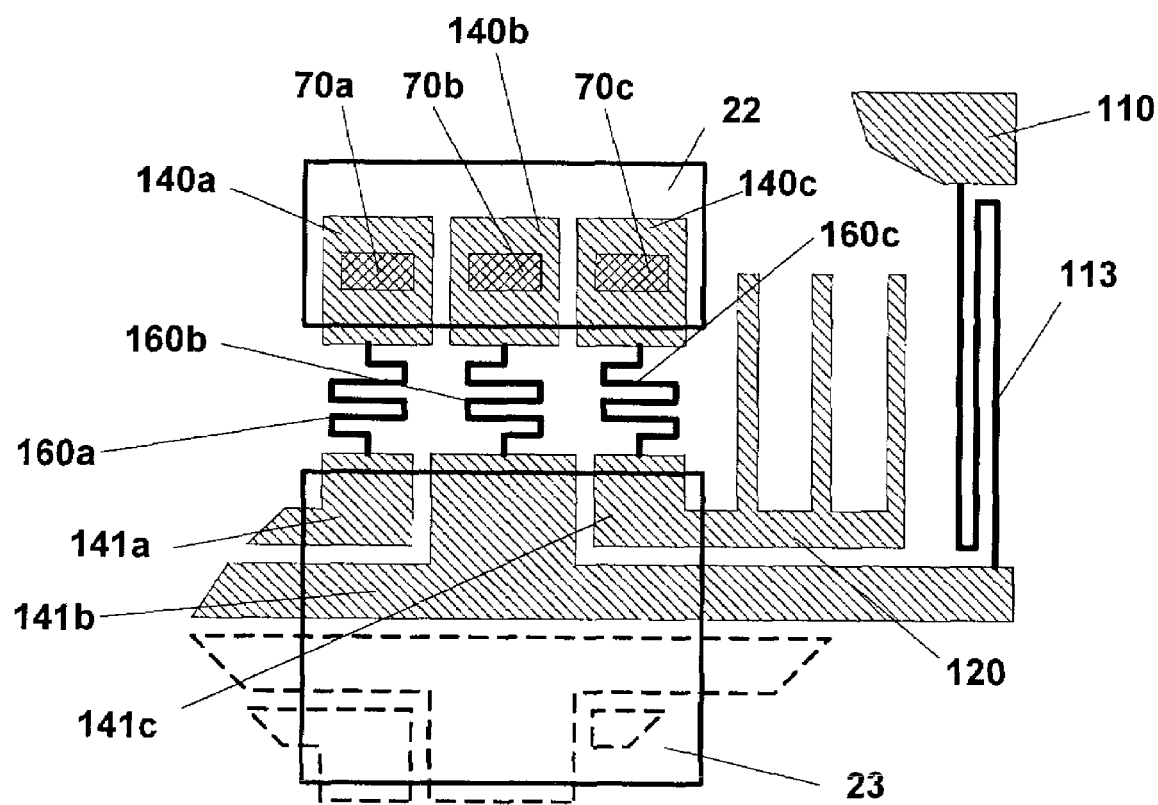
FIG. 8 illustrates an implementation for the anchoring system of FIG. 4A.

FIG. 8 illustrates a top view of implementation for the anchoring system of FIG. 4A with top substrate 10 and bottom substrate 50 omitted to provide clarity. A plurality of first portions 140a-c of the anchoring system are rigidly connected to the bottom substrate 50 through the plurality of aluminum germanium bonds 70a-c. The plurality of first portions 140a-c are rigidly connected to the top substrate through the post 22. A plurality of second portions 141a-c of the anchoring system is rigidly connected to the top substrate 10 through the post 23. The first portions 140a-c and the second portions 141a-c are flexibly connected through the plurality of springs 160a-c which provide electrical contact between the bottom substrate 50 and plurality of rigidly connected MEMS structures 120 and flexibly connected MEMS structures 110 connected to the plurality of the second portion of the anchor through the flexure 113.

Figure 9:
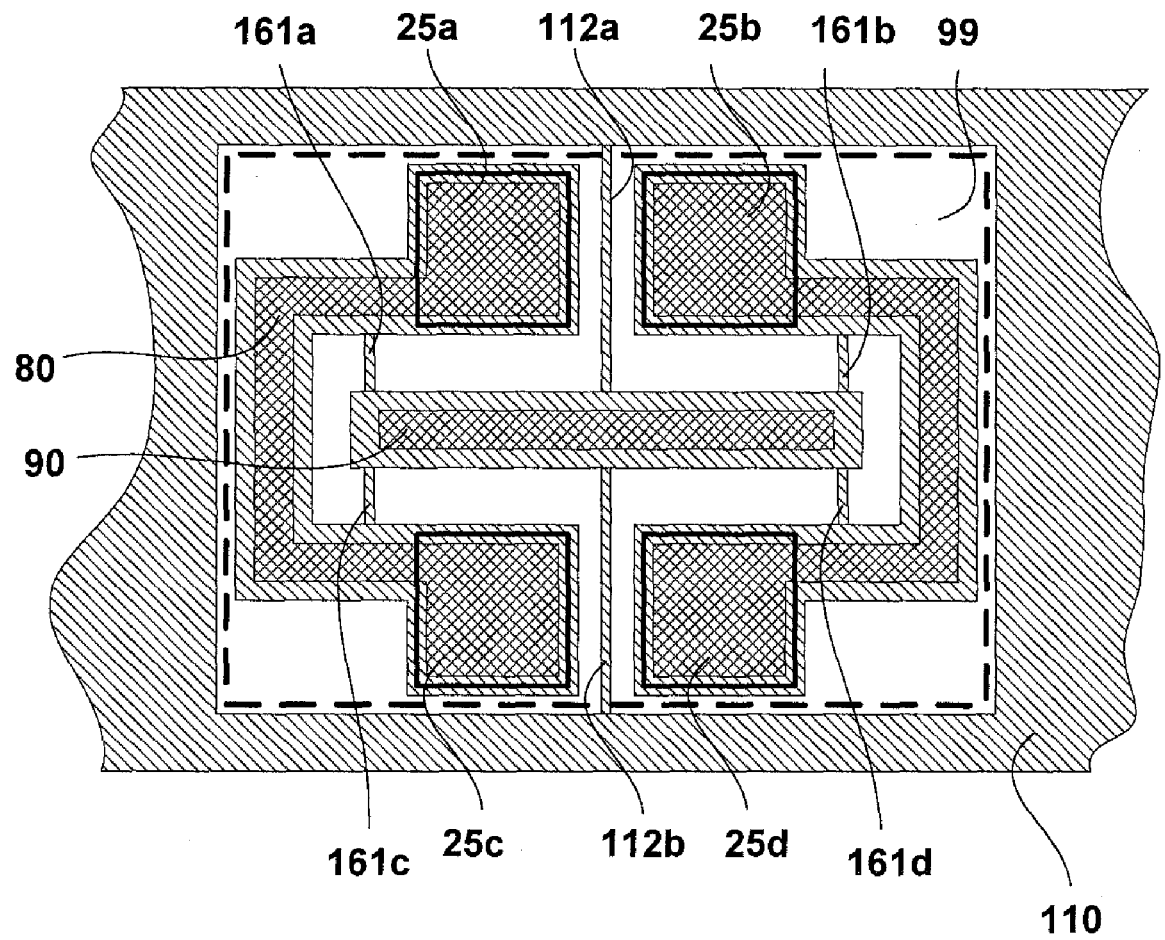
FIG. 9 illustrates a second implementation of an anchoring system of FIGS. 4A and 4B.

FIG. 9 illustrates a top view of second implementation of an anchoring system of FIGS. 4A and 4B with top substrate 10 and bottom substrate 50 omitted to provide clarity. A first portion 80 of the anchoring system is rigidly connected to the top substrate through plurality of posts 25a-d. A second portion 90 of the anchoring system and the first portion of the anchoring system are flexibly coupled through the plurality of flexures 161a-d. MEMS device 110 is flexibly attached to the second portion of the anchor 90 through the plurality of springs 112a-b. Continous aluminum plate 99 may be shared by both the first portion of the anchoring system 80 and the second portion 90 of the anchoring system in order to improve bonding.

Figure 10:
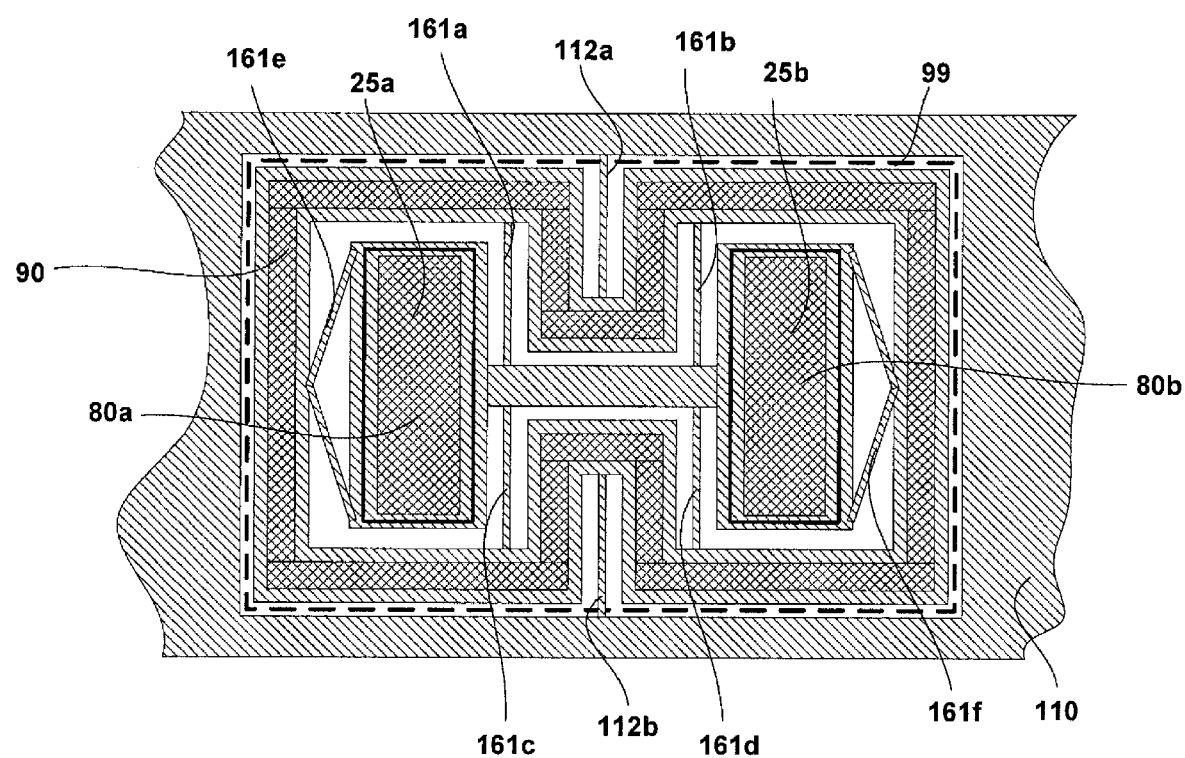
FIG. 10 illustrates a third implementation of an anchoring system in accordance with FIGS. 4A and 4B.

FIG. 10 illustrates a top view of third implementation of an anchoring system in accordance with FIGS. 4A and 4B with top substrate 10 and bottom substrate 50 omitted to provide clarity. A plurality of first portions 80a-b of the anchoring system are rigidly connected to the top substrate through the plurality of posts 25a-b. The second portion 90 of the anchoring system 90 and the plurality of the first portions 80a-b of the anchoring system 80a-b are flexibly coupled through the plurality of flexures 161a-f. The MEMS device 110 is flexibly attached to the second portion 90 of the anchoring system 90 through the plurality of springs 112a-b. The continuous aluminum plate 99 may be shared by both the plurality of the first portions 80a-b of the anchoring system 80a-b and the second portion 90 of the anchoring system in order to improve bonding.

Figure 11:
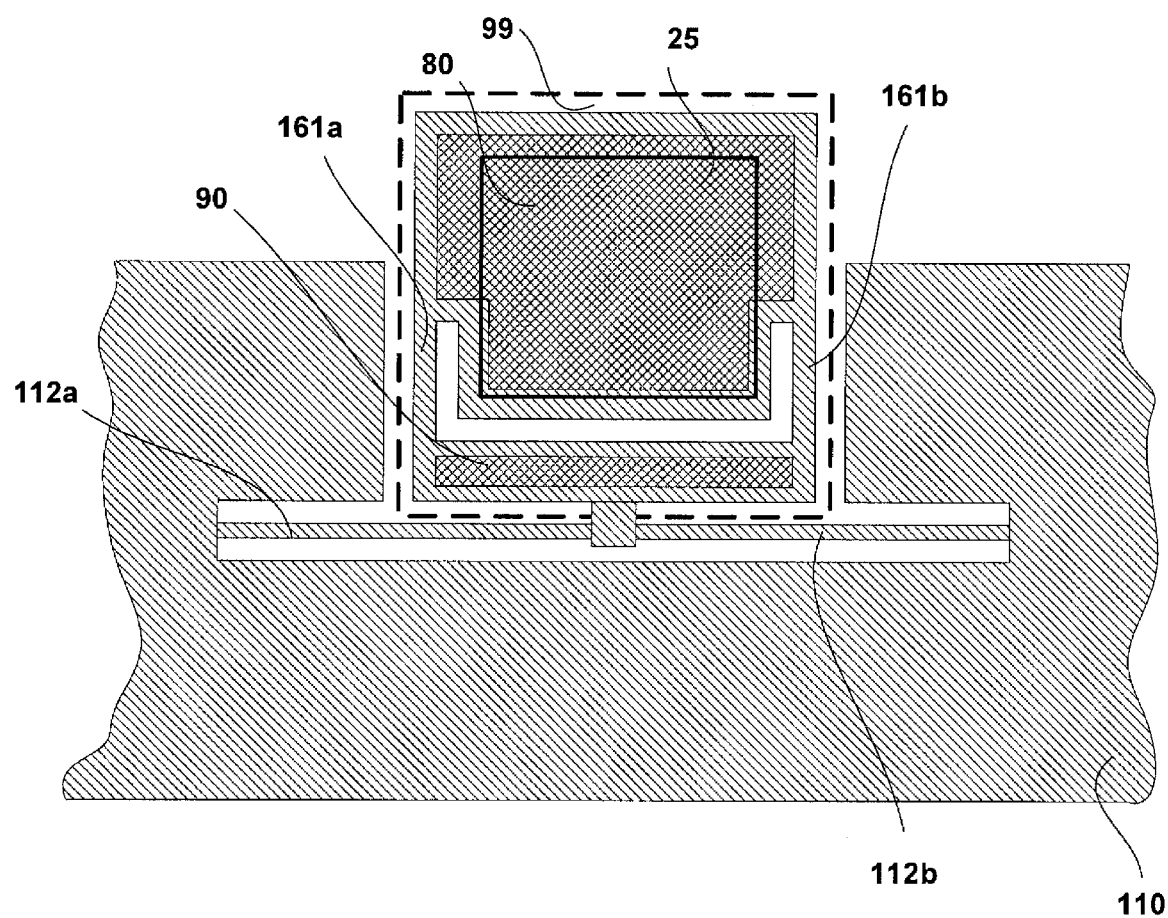
FIG. 11 illustrates a fourth implementation of an anchoring system in accordance with FIGS. 4A and 4B.

FIG. 11 illustrates a top view of fourth implementation of an anchoring system in accordance with FIGS. 4A and 4B with top substrate 10 and bottom substrate 50 omitted to provide clarity. In this embodiment, a first portion 80 of the anchoring system is rigidly connected to the top substrate through the post 25. The second portion of the anchor 90 and the first portions of the anchor 80 are flexibly coupled through the plurality of flexures 161a-b. The MEMS device 110 is flexibly attached to the second portion of the anchor 90 through the plurality of springs 112a-b. The continous aluminum plate 99 may be shared by both first portion of the anchor 80 and the second portion of the anchor 90 in order to improve bonding.

The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

The invention claimed is:

1. An assembly for anchoring a micro-electro-mechanical system (MEMS) device, the MEMS device comprising a top substrate; and a bottom substrate substantially parallel to the top substrate; the assembly comprising:

a first portion of the anchoring assembly between the top substrate and the bottom substrate; the first portion of the anchoring assembly rigidly connected to the top substrate; and the first portion of the anchoring assembly rigidly connected to the bottom substrate;

a second portion of the anchoring assembly between the top substrate and the bottom substrate; the second portion of the anchoring assembly rigidly connected to the top substrate; the second portion of the anchoring assembly being an anchoring point for the MEMS device; and a flexible element to couple the first portion and the second portion; the flexible element providing the electrical connection between the first portion and the second portion.

2. A micro-electro-mechanical system (MEMS) device comprising:
   a first substrate;
   an actuator layer;
   a second substrate;
   an anchor subassembly in the actuator layer; wherein the anchor subassembly includes:
   a first portion of the anchoring assembly between the top substrate and the bottom substrate;
   the first portion of the anchoring assembly rigidly connected to the top substrate;
   and the first portion of the anchoring assembly rigidly connected to the bottom substrate;
   a second portion of the anchoring assembly between the top substrate and the bottom substrate; the second portion of the anchoring assembly rigidly connected to the top substrate; the second portion of the anchoring assembly being an anchoring point for the MEMS device; and
   a flexible element to couple the first portion and the second portion; the flexible element providing the electrical connection between the first portion and the second portion.

3. An assembly for anchoring a micro-electro-mechanical system (MEMS) device, the assembly comprising:
   a top substrate;
   a bottom substrate substantially parallel to the top substrate;
   a first portion of the anchor between the top substrate and the bottom substrate; the first portion of the anchor rigidly connected to the top substrate; and the first portion of the anchor rigidly connected to the bottom substrate;
   a second portion of the anchor between the top substrate and the bottom substrate; the second portion of the anchor rigidly connected to the bottom substrate; the second portion of the anchor being an anchoring point for the MEMS device; and
   a substantially flexible mechanical element coupling the first portion of the anchor and the second portion of the anchor; the flexible element providing the electrical connection between the first portion of the anchor and the second portion of the anchor.

4. The assembly of claim 3 wherein:
   the flexible element is substantially rigid in the direction perpendicular to the top substrate and to the direction perpendicular to the bottom substrate to provide enough pressure for bonding;
   the flexible element is substantially flexible in the direction parallel to the top substrate and to the bottom substrate to decouple two portions of the anchor mechanically.

5. The assembly of claim 3 wherein:
   the first portion of the anchor and the second portion of the anchor are eutecticly bonded to an exposed and continuous aluminum plate on the bottom (ASIC) substrate such that bond starts forming under the first portion of the anchor and propagates towards the second portion of the anchor.

6. A micro-electro-mechanical system (MEMS) device, comprising:
   a first substrate;
   an actuator layer;
   a second substrate;
   an anchor subassembly in actuator layer; wherein the anchor subassembly includes:
   a first portion of the anchor between the top substrate and the bottom substrate; the first portion of the anchor rigidly connected to the top substrate; and the first portion of the anchor rigidly connected to the bottom substrate;
   a second portion of the anchor between the top substrate and the bottom substrate; the second portion of the anchor rigidly connected to the bottom substrate; the second portion of the anchor being an anchoring point for the MEMS device; and
   a substantially flexible mechanical element coupling the first portion of the anchor and the second portion of the anchor; the flexible element providing the electrical connection between the first portion of the anchor and the second portion of the anchor.

7. The assembly of claim 6 wherein:
   the first portion of the anchor and the second portion of the anchor are eutecticly bonded to an exposed and continuous aluminum plate on the bottom (ASIC) substrate such that bond starts forming under the first portion of the anchor and propagates towards the second portion of the anchor.

8. The MEMS device of claim 4 wherein the first portion of the anchor encircles the second portion of the anchor.

9. The MEMS device of claim 4 wherein the second portion of the anchor encircles the first portion of the anchor.

10. The MEMS device of claim 4 wherein the first portion of the anchor is parallel to the second portion of the anchor.

* * * * *